United States Patent
Huang et al.

(10) Patent No.: US 9,851,638 B2
(45) Date of Patent: Dec. 26, 2017

(54) PHOTOSENSITIVE POLYSILOXANE COMPOSITION AND USES THEREOF

(71) Applicant: CHI MEI CORPORATION, Tainan (TW)

(72) Inventors: Wei-Jie Huang, Tainan (TW); Chun-An Shih, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 15/287,127

(22) Filed: Oct. 6, 2016

(65) Prior Publication Data

US 2017/0023860 A1    Jan. 26, 2017

Related U.S. Application Data

(62) Division of application No. 14/332,680, filed on Jul. 16, 2014.

(30) Foreign Application Priority Data

Jul. 25, 2013  (TW) .............................. 102123367 A (51) Int. Cl.
| G03F 7/023 | (2006.01) |
| G03F 7/075 | (2006.01) |
| G03F 7/038 | (2006.01) |
| G03F 7/16 | (2006.01) |
| G03F 7/20 | (2006.01) |
| G03F 7/32 | (2006.01) |
| G03F 7/40 | (2006.01) |

(52) U.S. Cl.
CPC ............ *G03F 7/0233* (2013.01); *G03F 7/038* (2013.01); *G03F 7/0757* (2013.01); *G03F 7/0758* (2013.01); *G03F 7/162* (2013.01); *G03F 7/2002* (2013.01); *G03F 7/327* (2013.01); *G03F 7/40* (2013.01)

(58) Field of Classification Search
CPC ...... G03F 7/0233; G03F 7/038; G03F 7/0757; G03F 7/0758; G03F 7/162; G03F 7/2002; G03F 7/327; G03F 7/40
See application file for complete search history.

(56) References Cited

FOREIGN PATENT DOCUMENTS

JP    2011-002712    *    1/2011    ............. G03F 7/075

OTHER PUBLICATIONS

Machine translation of JP 2011-002712. Jan. 2011.*

* cited by examiner

*Primary Examiner* — John E Uselding
(74) *Attorney, Agent, or Firm* — WPAT, P.C., Intellectual Property Attorneys; Anthony King (57) ABSTRACT

The invention relates to a photosensitive polysiloxane composition and a thin film formed by the aforementioned photosensitive polysiloxane composition. The thin film is a planarization film of a TFT substrate, an interlayer insulating film or an overcoat of a core material or a protective material in a waveguide. The invention is to provide a photosensitive polysiloxane composition having excellent surface flatness and high tapered angle of a pattern. The photosensitive polysiloxane composition comprises a polysiloxane (A), an o-naphthoquinone diazide sulfonic acid ester (B), an alkali-soluble resin containing a silyl group (C) and a solvent (D).

3 Claims, 2 Drawing Sheets

FIG. 1

FIG. 2

# PHOTOSENSITIVE POLYSILOXANE COMPOSITION AND USES THEREOF

BACKGROUND OF THE INVENTION

1. Field of the Invention

The invention relates to a photosensitive polysiloxane composition and a thin film and device formed by the aforementioned photosensitive polysiloxane composition. The thin film is a planarization film of a thin film transistor (TFT) substrate in a liquid crystal display element or organic light-emitting display device, an interlayer insulating film or an overcoat of a core material or a protective material in a waveguide. More particularly, the invention is to provide a photosensitive polysiloxane composition having excellent surface flatness and high tapered angle of a pattern after exposing and developing.

2. Description of the Related Art

In recent years, in the field of the semiconductor industry, liquid crystal displays (LCDs) and organic electro-luminescence displays (OELDs), with the size reduction, the demand of the miniaturization of the pattern(s) in the photolithography process is increased. Generally, the miniaturized pattern is formed by exposing and developing a positive photosensitive composition having high resolution and high photosensitivity; wherein, a positive photosensitive composition using a polysiloxane as the main component has become the mainstream in this field.

Japanese Patent Publication No. 2008-107529 discloses a photosensitive composition for a curing film of a high degree of transparency. The photosensitive composition uses a polysiloxane comprising oxetanyl or succinic anhydride groups, which forms a hydrophilic structure through a ring-opening reaction in a copolymerization. Although the photosensitive composition has high solubility in a weak alkaline developer, the poor flatness of the surface and low tapered angle of a pattern of the photosensitive composition can not be accepted in this field.

Therefore, a photosensitive polysiloxane composition that enhancing the surface flatness, tapered angle of a pattern and transparency at the same time is a target remained to be achieved.

SUMMARY OF THE INVENTION

In the present invention, a specific polysiloxane and alkali-soluble resin having a silyl group are provided to obtain a photosensitive polysiloxane composition having good transparency, surface flatness and tapered angle of a pattern.

Therefore, the invention relates to a photosensitive polysiloxane composition comprising:
a polysiloxane (A);
an o-naphthoquinone diazide sulfonic acid ester (B);
an alkali-soluble resin containing a silyl group (C); and
a solvent (D).

The present invention also provides a method for forming a thin film on a substrate comprising applying the photosensitive polysiloxane composition as mentioned above on the substrate.

The present invention also provides a thin film on a substrate, which is manufactured by the method as mentioned above.

The present invention further provides a device comprising the thin film as mentioned above.

DETAILED DESCRIPTION OF THE INVENTION

The invention relates to a photosensitive polysiloxane composition comprising:
a polysiloxane (A);
an o-naphthoquinone diazide sulfonic acid ester (B);
an alkali-soluble resin containing a silyl group (C); and
a solvent (D).

The kind of the polysiloxane (A) is not particularly limited, as long as the purpose of the present invention can be fulfilled. The polysiloxane (A) is preferably obtained by polymerization (i.e. hydrolysis and partial condensation) using a silane monomer, a siloxane prepolymer or the combination of the silane monomer and siloxane prepolymer.

The polysiloxane (A) is copolymerized by a compound represented by Formula (4):

$$Si(R_a)_W(OR_b)_{4-W} \quad \text{Formula (4)},$$

wherein:
$R_a$ represents hydrogen, an alkyl group containing 1 to 10 carbon atoms, an alkenyl group containing 2 to 10 carbon atoms, an aryl group containing 6 to 15 carbon atoms, an alkyl group containing an acid anhydride group, an alkyl group containing an epoxy group, or an alkoxy group containing an epoxy group; when $R_a$ is plural, each $R_a$ is the same or different;
$R_b$ represents hydrogen, an alkyl group containing 1 to 6 carbon atoms, an acyl group containing 1 to 6 carbon atoms, an aryl group containing 6 to 15 carbon atoms; when $R_b$ is plural, each $R_b$ is the same or different; and
w represents an integer from 0 to 3.

In details, when $R_a$ in Formula (4) represents the alkyl group containing 1 to 10 carbon atoms, examples of $R_a$ are methyl, ethyl, n-propyl, isopropyl, n-butyl group, tertiary butyl, n-hexyl or n-decyl. Besides, $R_a$ may also be an alkyl group with an other substituted group; for example, trifluoromethyl, 3,3,3-trifluoro-propyl, 3-aminopropyl, 3-mercaptopropyl or 3-isocyanatepropyl.

When $R_a$ in Formula (4) represents the alkenyl group containing 2 to 10 carbon atoms; $R_a$ is, for example, vinyl. Besides, $R_a$ may also be an alkenyl group with an other substituent group; for example, 3-acryloxypropyl or 3-methacryloxypropyl.

When $R_a$ in Formula (4) represents the aryl group containing 6 to 15 carbon atoms, $R_a$ is, for example, phenyl, tolyl, or naphthyl. Besides, $R_a$ may also be an aryl group having an other substituent in the aromatic group; for example, o-hydroxyphenyl, 1-(o-hydroxyphenyl) ethyl, 2-(o-hydroxyphenyl) ethyl or 4-hydroxy-5-(p-hydroxyphenylcarbonyloxy) pentyl.

When $R_a$ in Formula (4) represents the alkyl group containing the acid anhydride group, the alkyl group is preferably the alkyl group containing 1 to 10 carbon atoms. Examples of the alkyl group containing the acid anhydride group are groups represented by Formulas (4-1) to (4-3) as shown below. It is noted that the acid anhydride group is formed by intramolecular dehydration of a dicarboxylic acid, and examples of the dicarboxylic acid are succinic acid or glutaric acid.

Formula (4-1)

Formula (4-2)

Formula (4-3)

When $R_a$ in Formula (4) represents the alkyl group containing the epoxy group, the alkyl group is preferably the alkyl group containing 1 to 10 carbon atoms. Examples of the alkyl group containing the epoxy group are oxetanylpentyl or 2-(3,4-epoxycyclohexyl) ethyl. It is noted that the epoxy group is a group formed by intramolecular dehydration of a diol, and the diol is, for example, propylene glycol, butanediol, pentanediol.

When $R_a$ in Formula (4) represents the alkoxy group containing the epoxy group, the alkoxy group is preferably the alkoxy group containing 1 to 10 carbon atoms. Examples of the alkoxy group containing the epoxy group are glycidoxypropyl or 2-oxetanylbutoxy.

Further, when $R_b$ in Formula (4) represents the alkyl group containing 1 to 6 carbon atoms, $R_b$ is, for example, methyl, ethyl, n-propyl, isopropyl or n-butyl. When $R_b$ in Formula (4) represents the acyl group containing 1 to 6 carbon atoms, $R_b$ is, for example, acetyl. When $R_b$ in Formula (4) represents an aryl group containing 6 to 15 carbon atoms, $R_b$ is, for example, phenyl.

In Formula (4), w is an integer from 0 to 3. When w represents 2 or 3, a plurality of $R_a$ may be the same or different; when w represents 1 or 2, a plurality of $R_b$ may be the same or different.

In the Formula (4), when w represents 0, which means that the silane monomer is a tetrafunctional silane monomer (i.e., silane monomer having four hydrolyzable groups); when w represents 1, which means that the silane monomer is a trifunctional silane monomer (i.e., silane monomer with three hydrolyzable groups); when w represents 2, which means that the silane monomer is a bifunctional silane monomer (i.e., silane monomer having two hydrolyzable groups); when w represents 3, which means that the silane monomer is a monofunctional silane monomer (i.e. silane monomer having one hydrolyzable group). It is noted that such hydrolyzable group is defined as a group able to carry on a hydrolysis reaction and to bond with silicon. For example, the hydrolyzable group may be an alkoxy group, an acyloxy group, or a phenoxy group.

In one embodiment of the present invention, the silane monomer is:

(1) the tetrafunctional silane monomer: tetramethoxysilane, tetraethoxysilane, tetraacetoxysilane, or tetraphenoxy silane;

(2) the trifunctional silane monomer: methyltrimethoxysilane (MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryloxypropyltrimethoxysilane, 3-methacryloxypropyltrimethoxysilane (MPTMS), 3-methacryloxypropyltriethoxysilane, phenyltrimethoxysilane (PTMS), phenyltriethoxysilane (PTES), p-hydroxyphenyltrimethoxysilane, 1-(p-hydroxyphenyl)ethyltrimethoxysilane, hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl) ethyltrimethoxysilane, 3-mercaptopropyltrimethoxysilane, 2-oxetanylbutoxypropyltriphenoxysilane, the commercially available products from Toagosei Company: 2-oxetanylbutoxypropyltrimethoxysilane (trade name: TMSOX-D), 2-oxetanylbutoxypropyltriethoxysilane (trade name: TESOX-D), 3-triphenoxysilyl propyl succinic anhydride, the commercially available products from Shin-Etsu Chemical Co., Ltd.: 3-trimethoxysilyl propyl succinic anhydride (trade name: X-12-967), the commercially available products from WACKER Company: 3-(triethoxysilyl) propyl succinic anhydride (trade name: GF-20), 3-(trimethoxysilyl) propyl glutaric anhydride (TMSG), 3-(triethoxysilyl) propyl glutaric anhydride, or 3-(triphenoxysilyl) propyl glutaric anhydride;

(3) the bifunctional silane monomer: dimethyldimethoxysilane (DMDMS), dimethyldiethoxysilane, dimethyldiacetyloxysilane, di-n-butyldimethoxysilane, diphenyldimethoxysilane, diisopropoxy-di(2-oxetanylbutoxypropyl)silane (DIDOS), di(3-oxetanylpentyl)dimethoxy silane, di-(n-butoxysilyl) di(propyl succinic anhydride), or (dimethoxysilyl) di(ethyl succinic anhydride);

(4) the monofunctional silane monomer: trimethylmethoxysilane, tri-n-butylethoxysilane, 3-glycidoxypropyldimethylmethoxysilane, 3-glycidoxypropyldimethylethoxysilane, di(2-oxetanylbutoxypentyl)-2-oxetanylpentylethoxysilane, tri(2-oxetanylpentyl)nethoxy silane, phenoxysilyltripropyl succinic anhydride, or methoxysilyldiethyl succinic anhydride. This silane monomer may be used singly or in combination.

The polysiloxane (A) preferably includes a polysiloxane prepolymer represented by Formula (4-4):

Formula (4-4)

wherein, in Formula (4-4), $R_c$, $R_d$, $R_e$ and $R_f$ each independently represents hydrogen, an alkyl group containing 1 to 10 carbon atoms, an alkenyl group containing 2 to 6 carbon atoms, an aryl group containing 6 to 15 carbon atoms. It is noted that any one of the above alkyl group, alkenyl group and aryl group may optionally have a substituent. When s is an integer from 2 to 1000, $R_c$ may be the same or different, and $R_d$ may be the same or different. The alkyl group, for example, is methyl, ethyl or n-propyl; the alkenyl group, for example, is vinyl, acryloyl-propyl or ethyl-acryloyloxy-propy; the aryl group, for example, is phenyl, tolyl, or naphthyl.

$R_g$ and $R_h$ each independently represents hydrogen, an alkyl group containing 1 to 6 carbon atoms, an acyl group containing 1 to 6 carbon atoms, an aryl group containing 6 to 15 carbon atoms. It is noted that any one of the above alkyl group, acyl group and aryl group may optionally have a substituent. The alkyl group, for example, is methyl, ethyl, n-propyl, isopropyl or n-butyl; the acyl group, for example, is acetyl; the aryl group, for example, is phenyl.

In Formula (4-4), s is an integer selected from 1 to 1000; s preferably is an integer selected from 3 to 300; and s more preferably is an integer selected from 5 to 200.

The polysiloxane prepolymer represented by Formula (4-4) may be used singly or in combination. The polysiloxane prepolymer in Formula (4-4) may be, for example, 1,1,3,3-tetramethyl-1,3-dimethoxy disiloxane, 1,1,3,3-tetramethyl-1,3-diethoxy disiloxane, 1,1,3,3-tetraethyl-1,3-diethoxy disiloxane or the commercially available products of silanol terminated polydimethylsiloxane by Gelest Company (trade names such as DM-S12 (molecular weight of 400 to 700), DMS-S15 (molecular weight of 1500 to 2000), DMS-S21 (molecular weight 4200), DMS-S27 (molecular weight 18000), DMS-S31 (molecular weight 26000), DMS-S32 (molecular weight 36000), DMS-S33 (molecular weight 43500), DMS-S35 (molecular weight 49000), DMS-S38 (MW 58000) DMS-S42 (molecular weight 77000) or PDS-9931 (MW 1000-1400)).

It is noted that the silane monomer may be used in combination with the polysiloxane prepolymer, and the mixing ratio thereof is not particularly limited. Preferably, the molar ratios of silicon atoms in the silane monomer and the polysiloxane prepolymer are from 100:0.01 to 50:50.

In addition, the polysiloxane (A) may be prepared through copolymerization of the silane monomer and/or the polysiloxane prepolymer, or in combination with silicon dioxide particles. The average particle diameter of the silicon dioxide particles is not particularly limited and ranges from 2 nm to 250 nm, preferably from 5 nm to 200 nm, and more preferably from 10 nm to 100 nm.

The silicon dioxide particles may be used singly or in combination. The silicon dioxide particles are, for example, commercially available products manufactured by Jgc Catalysts & Chemicals Co., Ltd. [trade names: Oscar 1132 (particle diameter of 12 nm; dispersing agent is methanol), OSCAR 1332 (particle diameter of 12 nm; dispersant n-propanol), OSCAR 105 (particle size 60 nm; dispersant γ-butyrolactone), OSCAR 106 (particle diameter of 120 nm; dispersant diacetone alcohol), etc.]; commercially available products by Fuso Chemical Co. [trade names: Quartron PL-1-IPA (particle diameter of 13 nm; dispersant isobutyl ketone), Quartron PL-1-TOL (particle diameter of 13 nm; dispersant toluene), Quartron PL-2L-PGME (18 nm particle size; diacetone alcohol propylene glycol monomethyl ether) or Quartron PL-2L-MEK (particle size 18 nm; dispersant methyl ethyl ketone)]; or commercially available products manufactured by Nissan Chemical Company [trade names, such as IPA-ST (particle diameter 12 nm; dispersant isopropanol), EG-ST (particle diameter of 12 nm; dispersant ethylene glycol), IPA-ST-L (particle size 45 nm; dispersant isopropanol) or IPA-ST-ZL (particle diameter of 100 nm; dispersant isopropyl alcohol)].

The silicon dioxide particles may be used in combination with the silane monomer and/or polysiloxane prepolymer and the mixing ratio is not particularly limited. The molar ratio of silicon atoms in the silicon dioxide particles and polysiloxane prepolymer is preferably from 1:100 to 50:100.

In addition, the polysiloxane (A) may be prepared through copolymerization of the silane monomer and/or the polysiloxane prepolymer and/or the silicon dioxide particles or in combination with the alkali-soluble resin containing the silyl group (C).

The amount of the alkali-soluble resin containing the silyl group (C) in the above polymerization reaction is not particularly limited. Based on 100 parts by weight of the used amount of the silane monomer, the used amount of the alkali-soluble resin containing the silyl group (C) is from 0.5 parts by weight to 40 parts by weight; preferably the used amount of the alkali-soluble resin containing the silyl group (C) is from 3 parts by weight to 35 parts by weight; more preferably the used amount of the alkali-soluble resin containing the silyl group (C) is from 5 parts by weight to 30 parts by weight.

In general, the polymerization reaction (i.e. hydrolysis and condensation) of the silane monomer, polysiloxane prepolymer, silicon dioxide particles and/or alkali-soluble resin containing the silyl group (C) is based on the following steps: adding solvents, water and optionally catalyst in a mixture of the silane monomer, polysiloxane prepolymer, silicon dioxide particles and/or alkali-soluble resin containing the silyl group (C); heating and stirring under 50° C. to 150° C. for 0.5 to 120 hours, and removing byproducts (alcohols, water, etc.) by distillation.

The solvent used in the above polymerization reaction is not particularly limited, and the solvent may be the same or different from the solvent (D) included in the photosensitive polysiloxane composition of the present invention. Based on 100 parts by weight of the used amount of the silane monomer, and/or polysiloxane, the used amount of the solvent is preferably from 15 to 1200 g; preferably from 20 to 1100 g; and more preferably from 30 to 1000 g.

Based on the hydrolyzable groups of the silane monomer and/or polysiloxane prepolymer being 1 mole, the used amount of the water in the above polymerization reaction (i.e., water used in hydrolysis) is from 0.5 moles to 2 moles.

The catalyst used in the above polymerization reaction is not particularly limited, and is preferably selected from the group consisting of an acidic catalyst or a basic catalyst. The acidic catalyst may be, for example, hydrochloric acid, nitric acid, sulfuric acid, hydrofluoric acid, oxalic acid, phosphoric acid, acetic acid, trifluoroacetic acid, formic acid, polybasic carboxylic acid or an anhydride thereof, or ion exchange resins. The basic catalyst may be, for example, diethylamine, triethylamine, tripropylamine, tributylamine, tripentylamine, trihexylamine, triheptylamine, trioctylamine, diethanolamine, triethanolamine, sodium hydroxide, and potassium hydroxide, the amine group-containing silane having an alkoxy group or ion exchange resins and the like.

Based on 100 parts by weight of the used amount of the silane monomer and/or polysiloxane prepolymer, the used amount of the catalyst in the above polymerization reaction preferably is from 0.005 g parts by weight to 15 g parts by weight; more preferably 0.01 g parts by weight to 12 g parts by weight; and most preferably from 0.05 g parts by weight to 10 g parts by weight.

Concerning stability, the polysiloxane (A) preferably excludes the byproducts (such as alcohols or water) and the catalyst. Accordingly, the reaction mixture may be optionally purified after the polymerization reaction to manufacture the purified polysiloxane (A). The purification method is not particularly limited. A hydrophobic solvent is preferably used for the dilution of the reaction mixture. Subsequently, the hydrophobic solvent and the reaction mixture are transferred to a separation funnel, and the organic layer is then washed with water several times and concentrated by a rotary evaporator to remove the alcohol or water. In addition, ion exchange resins may be used to remove the catalyst.

In the present invention, when the polysiloxane (A) comprises the alkyl group containing an acid anhydride group, the alkyl group containing the epoxy group, the alkoxy group containing the epoxy group, it can provide functional groups to improve the tapered angle.

The kinds of the o-naphthoquinone diazide sulfonic acid ester (B) are not particularly limited, and common o-naphthoquinone diazide sulfonic acid esters may be used. The o-naphthoquinone diazide sulfonic acid ester (B) may be completely esterified or partially esterified ester-based compound(s).

The O-naphthoquinone diazide sulfonic acid ester (B) is preferably prepared by reacting an o-naphthoquinone diazide sulfonic acid or salts thereof with a hydroxy compound. The O-naphthoquinone diazide sulfonic acid ester (B) is more preferably prepared by reacting the o-naphthoquinone diazide sulfonic acid or salts thereof with a polyhydroxy compound.

The O-naphthoquinone diazide sulfonic acid may be, for example, o-naphthoquinone diazide-4-sulfonic acid, o-naphthoquinone diazide-5-sulfonic acid or o-naphthoquinone diazide-6-sulfonic acid. In addition, the o-naphthoquinone diazide sulfonic acid salts may be, for example, o-naphthoquinone diazonaphthoquinone sulfonyl halides.

The hydroxy compound may be, for example:

(1) hydroxybenzophenone-based compounds, such as, 2,3,4-trihydroxy-benzophenone, 2,4,4'-trihydroxy-benzophenone, 2,4,6-trihydroxy-benzophenone, 2,3,4,4'-tetrahydroxy benzophenone, 2,4,2',4'-tetrahydroxy benzophenone, 2,4,6,3',4'-pentahydroxy-benzophenone, 2,3,4,2,4'-pentahydroxy-benzophenone, 2,3,4,2',5'-pentahydroxy-benzophenone, 2,4,5,3,5'-pentahydroxy-benzophenone or 2,3,4,3,4,5'-hexahydroxy-benzophenone.

(2) hydroxyaryl-based compounds, for example, a hydroxy aryl compound as shown by the Formula (5-1):

Formula (5-1)

wherein, in Formula (5-1), $R^{11}$ and $R^{12}$ each independently represents hydrogen, halogen or an alkyl group containing 1 to 6 carbon atoms; $R^{13}$, $R^{14}$, $R^{17}$ each independently represents hydrogen or an alkyl group containing 1 to 6 carbon atoms; $R^{15}$, $R^{16}$, $R^{18}$, $R^{19}$, $R^{20}$ and $R^{21}$ each independently represents hydrogen, halogen, an alkyl group containing 1 to 6 carbon atoms, an alkoxy group containing 1 to 6 carbon atoms, an alkenyl group containing 1 to 6 carbon atoms or a cycloalkyl group containing 1 to 6 carbon atoms; d, e and f each independently represents an integer selected from 1 to 3; z represents 0 or 1.

The hydroxyaryl-based compounds as shown in Formula (5-1) may be, for example, tris(4-hydroxyphenyl) methane, bis(4-hydroxy-3,5-dimethyl-phenyl)-4-hydroxyphenyl methane, bis(4-hydroxy-3,5-dimethyl-phenyl)-3-hydroxyphenyl methane, bis(4-hydroxy-3,5-dimethyl-phenyl)-2-hydroxyphenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-bis(hydroxyphenyl) methane bis(4-hydroxy-2,5-dimethylphenyl)-3,4-dihydroxyphenyl methane, bis(4-hydroxy-3,5-dimethylphenyl)-2,4-hydroxyphenyl methane, bis(4-hydroxy-2,5-dimethylphenyl)-2,4-dihydroxyphenyl methane, bis(4-hydroxyphenyl)-3-methoxy-4-hydroxyphenyl methane, bis(3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(3-cyclohexyl-4-hydroxy-6-methyl-phenyl)-2-hydroxyphenyl methane, bis(3-cyclohexyl-4-hydroxy-6-methyl-phenyl)-3-hydroxyphenyl methane, bis(3-cyclohexyl-4-hydroxy-6-methylphenyl)-4-hydroxyphenyl methane, bis(3-cyclohexyl-4-hydroxy-6-methyl-phenyl)-3,4-dihydroxyphenyl methane, bis(3-cyclohexyl-6-hydroxyphenyl)-3-hydroxyphenyl methane, bis(3-cyclohexyl-6-hydroxyphenyl)-4-hydroxyphenyl methane, bis(3-cyclohexyl-6-hydroxyphenyl)-2-hydroxyphenyl methane, bis(3-cyclohexyl-6-hydroxy-4-methylphenyl)-2-hydroxyphenyl methane, bis(3-cyclohexyl-6-hydroxy-4-methylphenyl)-4-hydroxyphenyl methane, bis(3-cyclohexyl-6-hydroxy-4-methyl-phenyl)-3,4-dihydroxyphenyl methane, 1-[1-(4-hydroxyphenyl)isopropyl]-4-[1,1-bis(4-hydroxyphenyl) ethyl] benzene or 1-[1-(3-methyl-4-hydroxyphenyl)isopropyl]-4-[1,1-bis(3-methyl-4-hydroxyphenyl)ethyl] benzene.

(3) (hydroxyphenyl) hydrocarbon compounds may be, for example, (hydroxyphenyl) hydrocarbon compounds represented by Formula (5-2):

Formula (5-2)

wherein in Formula (5-2), $R^{22}$ and $R^{23}$ each independently represents hydrogen or an alkyl group containing 1 to 6 carbon atoms; g and h each independently represents an integer selected from 1 to 3.

The (hydroxyphenyl)-hydrocarbon compounds as shown in Formula (5-2) may be, such as, 2-(2,3,4-trihydroxyphenyl)-2-(2',3',4'-trihydroxyphenyl) propane, 2-(2,4-dihydroxyphenyl)-2-(2',4'-dihydroxyphenyl) propane, 2-(4-hydroxyphenyl)-2-(4-hydroxyphenyl) propane, bis(2,3,4-trihydroxyphenyl) methane or bis(2,4-dihydroxyphenyl) methane and the like.

(4) other aromatic hydroxyl compounds, such as phenol, p-methoxyphenol, dimethylphenol, hydroquinone, bisphenol A, naphthol, catechol, 1,23-pyrogallol methyl ether, 1,2,3-pyrogallol-1,3-dimethyl ether, 3,4,5-trihydroxy benzoic acid, or partially esterified or etherified 3,4,5-trihydroxy benzoic acid.

The hydroxy compound is preferably 1-[1-(4-hydroxyphenyl) isopropyl]-4-[1,1-bis(4-hydroxyphenyl) ethyl] benzene, 2,3,4-trihydroxy-benzophenone, 2,3,4,4'-tetrahydroxy benzophenone, or a combination thereof. The hydroxy compounds may be used singly or in combination.

The reaction of o-naphthoquinone diazide sulfonic acid or the salts thereof with the hydroxy compound is usually performed in an organic solvent, such as dioxane, N-pyrrolidone, acetamides and etc. Furthermore, the reaction is preferably performed in an alkaline condensing agent, such as triethanolamine, alkali metal carbonates or alkali metal bicarbonates.

The degree of esterification of the o-naphthoquinone diazide sulfonic acid ester (B) is preferably more than 50%. That is, based on 100 mol % of the used amount of the hydroxyl groups in the hydroxy compound, 50 mole % or more hydroxyl groups in the hydroxy compound react with the o-naphthoquinone diazide sulfonic acid or salts thereof in the esterification reaction. The degree of esterification of the o-naphthoquinone diazide sulfonic acid ester (B) is more preferably 60% or more.

In one embodiment of the ivnention, based on 100 parts by weight of the used amount of the polysiloxane (A), the used amount of the o-naphthoquinone diazide sulfonic acid ester (B) is from 2 parts by weight to 30 parts by weight; preferably 3 parts by weight to 25 parts by weight; and more preferably 5 parts by weight to 20 parts by weight.

In the present invention, the alkali-soluble resin containing the silyl group (C) is copolymerized by an unsaturated carboxylic acid or unsaturated carboxylic anhydride (c-1), an unsaturated compound containing a silyl group (c-2) represented by Formula (1) and/or an other unsaturated compounds (c-3) in the presence of an appropriate polymerization initiator.

The aforementioned unsaturated carboxylic acid or unsaturated carboxylic anhydride (c-1) refers to a compound containing a structure of carboxylic acid or carboxylic anhydride and an unsaturated polymerizable bond without being limited to any specific structure. The compound includes but is not limited to an unsaturated monocarboxylic acid compound, an unsaturated dicarboxylic acid compound, an unsaturated acid anhydride compound, an unsaturated polycyclic carboxylic acid compound, an unsaturated polycyclic dicarboxylic acid compound and an unsaturated polycyclic acid anhydride compound.

Examples of the aforementioned unsaturated monocarboxylic acid compound are as below: (meth)acrylic acid, butenoic acid, α-chloracrylic acid, ethyl acrylate, cinnamic acid, 2-(meth)acryloyloxyethyl succinate monoester, 2-(meth)acryloyloxyethyl hexahydrophthalic acid ester, 2-(meth)acryloyloxyethyl phthalic acid ester and omega-carboxyl polycaprolactone polyol monoacrylate (trade name of ARONIX M-5300, manufactured by Toagosei Co., Ltd.).

Examples of the aforementioned unsaturated dicarboxylic acid compound are as below: maleic acid, fumaric acid, mesaconic acid, itaconic acid and traconic acid. In an example of the present invention, the unsaturated dicarboxylic acid anhydride compound is the anhydride compound of the aforementioned unsaturated dicarboxylic acid compound.

Examples of the aforementioned unsaturated polycyclic carboxylic acid compound are as below: 5-carboxyl bicyclo [2.2.1] hept-2-ene, 5-carboxyl-5-methylbicyclo [2.2.1] hept-2-ene, 5-carboxyl-5-ethylbicyclo [2.2.1] hept-2-ene, 5-carboxyl-6-methylbicyclo [2.2.1] hept-2-ene and 5-carboxyl-6-ethylbicyclo [2.2.1]hept-2-ene.

Examples of the aforementioned unsaturated polycyclic dicarboxylic acid compound are as below: 5,6-dicarboxylic bicyclo [2.2.1] hept-2-ene.

The aforementioned unsaturated polycyclic dicarboxylic acid anhydride compound is the anhydride compound of the aforementioned unsaturated polycyclic dicarboxylic acid compound.

The preferred examples of the aforementioned compound (c-1) of unsaturated carboxylic acid or unsaturated carboxylic anhydride are acrylic acid, methacrylic acid, maleic anhydride, 2-methacryloyloxyethyl succinate monoester and 2-methacryloyloxyethyl hexahydrophthalic acid.

The unsaturated carboxylic acid or unsaturated carboxylic anhydride (c-1) can be used separately or with a mixture of a plurality of the compounds (c-1). Based on 100 parts by weight of the total used amount of the unsaturated carboxylic acid or unsaturated carboxylic anhydride (c-1), the unsaturated compound containing the silyl group (c-2) represented by Formula (1) and other unsaturated compounds (c-3); the used amount of the unsaturated carboxylic acid or unsaturated carboxylic anhydride (c-1) is from 5 parts by weight to 35 parts by weight; preferably the used amount of the unsaturated carboxylic acid or unsaturated carboxylic anhydride (c-1) is from 8 parts by weight to 32 parts by weight; more preferably the used amount of the unsaturated carboxylic acid or unsaturated carboxylic anhydride (c-1) is from 10 parts by weight to 30 parts by weight.

According to the invention, the unsaturated compound containing the silyl group (c-2) is represented by Formula (1);

Formula (1)

wherein:

R represents a hydrogen atom or a methyl group;

a represents an integer selected from 1 to 6;

$R^2$ and $R^3$ independently represent an alkyl group containing 1 to 12 carbon atoms, a phenyl group, an alkoxy group containing 1 to 6 carbon atoms, or a group represented by Formula (2);

b represents an integer selected from 1 to 150; when $R^2$ and $R^3$ are plural, each $R^2$ and $R^3$ are the same or different;

$R^4$ represents an alkyl group containing 1 to 6 carbon atoms or a group represented by Formula (3);

Formula (2)

wherein:

$R^5$, $R^6$ and $R^7$ independently represent an alkyl group containing 1 to 12 carbon atoms or a phenyl group;

c represents an integer selected from 2 to 13; when $R^6$ and $R^7$ are plural, each $R^6$ and $R^7$ are the same or different; and Formula (3)

wherein:

$R^8$, $R^9$ and $R^{10}$ independently represent an alkyl group containing 1 to 12 carbon atoms or a phenyl group.

The alkyl group containing 1 to 12 carbon atoms, for example, is methyl group, ethyl group, propyl group, butyl group, amyl group, hexylgroup, heptyl group, octylgroup, nonyl group, or decyl group.

The alkoxy group containing 1 to 6 carbon atoms, for example, is methoxy group, ethoxy group, propoxy group, and butoxy group.

The unsaturated compound containing the silyl group (c-2) represented by Formula (1) comprises an allylsilane and methacrylic silanes. Examples are 3-methacryloxypropyltrimethoxysilane, 3-methacryloxypropyltriethoxysilane, 3-methacryloxypropylmethyldimethoxysilane, 3-methacryloxypropylmethyldiethoxysilane, compounds represented by Formulas (1-1) to (1-6), or FM-0711, FM-0721, FM-0725 (manufactured by Chisso Corporation).

Formula (1-1)

Formula (1-2)

Formula (1-3)

Formula (1-4)

Formula (1-5)

Formula (1-6)

The preferred examples of the aforementioned unsaturated compound containing the silyl group (c-2) represented by Formula (1) are 3-methacryloxypropyltrimethoxysilane, 3-methacryloxypropyltriethoxysilane, FM-0711 (manufactured by Chisso Corporation) or combinations thereof.

The aforementioned unsaturated compound containing the silyl group (c-2) can be used separately or with a mixture of a plurality of the compounds (c-2). Based on the total used amount of the unsaturated carboxylic acid or unsaturated carboxylic anhydride (c-1), the used amount of the unsaturated compound containing the silyl group (c-2) represented by Formula (1) and other unsaturated compounds (c-3) is 100 parts by weight, the used amount of the unsaturated compound containing the silyl group (c-2) is from 5 parts by weight to 65 parts by weight; preferably the used amount of the unsaturated compound containing the silyl group (c-2) is from 8 parts by weight to 60 parts by weight; more preferably the used amount of the unsaturated compound containing the silyl group (c-2) is from 10 parts by weight to 55 parts by weight.

The aforementioned other unsaturated compounds (c-3) may include but not limited to (meth)acrylic ester compounds containing an epoxy group, α-alkyl acrylate compounds containing an epoxy group and epoxypropyl ether compounds, alkyl (meth)acrylate, alicyclic (meth)acrylate, aryl (meth)acrylate, unsaturated dicarboxylic diester, hydroxyalkyl (meth)acrylate, polyether of (meth)acrylic esters, aromatic vinyl compounds and other unsaturated compounds except the aforementioned unsaturated compounds.

Examples of the aforementioned (meth)acrylic ester compounds containing the epoxy group are as below: glycidyl (meth)acrylate, 2-methylglycidyl (meth)acrylate, 3,4-epoxybutyl (meth)acrylate, 6,7-epoxyheptyl (meth)acrylate, 3,4-epoxycyclohexyl (meth)acrylate and 3,4-epoxycyclohexylmethyl (meth)acrylate.

Examples of the aforementioned α-alkyl acrylate compounds containing the epoxy group are as below: glycidyl α-ethacrylate, glycidyl, α-n-propylacrylate, glycidyl α-n-butylacrylate and 6,7-epoxyheptyl α-ethacrylate.

Examples of the aforementioned epoxypropyl ether compounds are as below: o-vinylbenzylglycidylether, m-vinylbenzylglycidylether and p-vinylbenzylglycidylether.

Examples of the aforementioned alkyl (meth)acrylate are as below: methyl (meth)acrylate, ethyl (meth)acrylate, n-propyl (meth)acrylate, isopropyl (meth)acrylate, n-butyl (meth)acrylate, iso-butyl (meth)acrylate, sec-butyl (meth)acrylate and tert-butyl (meth)acrylate.

Examples of the aforementioned alicyclic (meth)acrylate are as below: cyclohexyl (meth)acrylate, 2-methylcyclohexyl (meth)acrylate, tricyclic[5.2.1.0$^{2,6}$]deca-8-yl (meth)acrylic ester (or referred to as dicyclopentanyl (meth)acrylate), dicyclopentyloxyethyl (meth)acrylate, isobornyl (meth)acrylate and tetrahydrofuranyl (meth)acrylate.

Examples of the aforementioned aryl (meth)acrylate are as below: phenyl (meth)acrylate and benzyl (meth)acrylate. Examples of the aforementioned unsaturated dicarboxylic diester are as below: diethyl maleate, diethyl fumarate and diethyl itaconate.

Examples of the aforementioned hydroxyalkyl (meth)acrylate are as below: 2-hydroxyethyl (meth)acrylate and 2-hydroxypropyl (meth)acrylate.

Examples of the aforementioned polyether of (meth)acrylic esters are as below: polyglycol mono(meth)acrylate and polypropylene glycol mono(meth)acrylate.

Examples of the aforementioned aromatic vinyl compounds are as below: styrene monomer, α-methylstyrene, m-methylstyrene, p-methylstyrene and p-methoxy styrene.

Examples of the aforementioned other unsaturated compounds are as below: acrylonitrile, methacrylonitrile, chloroethylene, vinylidene chloride, acrylamide, methacrylamide, vinyl acetate, 1,3-butadiene, isoprene, 2,3-dimethyl 1,3-butadiene, N-cyclohexyl maleimide, N-phenyl maleimide, N-benzyl maleimide, N-succinimide-3-maleimidobenzoic ester, N-succimide-4-maleimidobutyric ester, N-succinimide-6-maleimidocaproate, N-succinimide-3-maleimido propionic ester and N-(9-acridinyl) maleimide.

The preferred examples of the aforementioned unsaturated compound containing the epoxy group (c-3) are as below: glycidyl methacylate, 3,4-epoxycyclohexylmethyl (meth)acrylate, 6,7-epoxyheptyl acrylate, O-vinylbenzylglycidylether, m-vinylbenzylglycidylether p-vinylbenzylglycidylether, methyl (meth)acrylate, butyl (meth)acrylate, 2-hydroxyethyl (meth)acrylate, tert-butyl (meth)acrylate, benzyl (meth)acrylate, dicyclopentanyl (meth)acrylate, dicyclopentyloxyethyl (meth)acrylate, styrene monomer and p-methoxy styrene.

The aforementioned other unsaturated compounds (c-3) can be used separately or with a mixture of a plurality of the compounds (c-3). Based on 100 parts by weight of the total used amount of the unsaturated carboxylic acid or unsaturated carboxylic anhydride (c-1), the used amount of the unsaturated compound containing the silyl group (c-2) represented by Formula (1) and other unsaturated compounds (c-3), the used amount of the other unsaturated compounds (c-3) is from 0 parts by weight to 90 parts by weight; preferably the uesd amount of the other unsaturated compounds (c-3) is from 8 parts by weight to 84 parts by weight; more preferably the used amount of the other unsaturated compounds (c-3) is from 15 parts by weight to 80 parts by weight.

During manufacturing, a solvent used for the alkali-soluble resin containing the silyl group (C) of the present invention may include but not limited to alcohol, ether, glycol ether, glycolalkyl ether acetate, diethylene glycol, dipropylene glycol, propylene glycol monoalkyl ether, propylene glycol monoalkyl ether acetate, propylene glycol monoalkyl ether propionate, aromatic hydrocarbon, ketone and ester.

Examples of the aforementioned alcohol are as below: methanol, ethanol, phenylcarbinol, 2-phenylethanol and 3-phenyl-1-propanol. Example of the aforementioned ether is tetrahydrofuran. Examples of the aforementioned glycol ether are as below: ethylene glycol monopropyl ether, ethylene glycol monomethyl ether and ethylene glycol monoethyl ether. Examples of the aforementioned glycolalkyl ether acetate are as below: glycolmonobutyl ether acetate, glycol ether acetate and glycol monomethyl ether acetate. Examples of the aforementioned diethylene glycol are as below: diethylene glycol monomethyl ether, diethylene glycol monoethyl ether, diethylene glycol monobutyl ether, diethylene glycol dimethyl ether, diethylene glycol diethyl ether, diethylene glycol ethyl methyl ether. Examples of the aforementioned dipropylene glycol are as below: dipropylene glycol monomethyl ether, dipropylene glycol monoethyl ether, dipropylene glycol dimethyl ether, dipropylene glycol diethyl ether and dipropylene glycol ethyl methyl ether. Examples of the aforementioned propylene glycol monoalkyl ether are as below: propylene glycol monomethyl ether, propylene glycol monoethyl ether, propylene glycol monopropyl ether and propylene glycol monobutyl ether. Examples of the aforementioned propylene glycol monoalkyl ether propionate are as below: propylene glycol monomethyl ether acetate, propylene glycol ethyl ether acetate, propylene glycol propyl ether acetate and propylene glycol butyl ether acetate. Examples of the aforementioned propylene glycol monoalkyl ether propionate are as below: propylene glycol monomethyl ether propionate, propylene glycol ethyl ether propionate, propylene glycol propyl ether propionate and propylene glycol butyl ether propionate. Examples of the aforementioned aromatic hydrocarbon are as below: methylbenzene and dimethylbenzene. Examples of the aforementioned ketone are as below: ethyl methyl ketone, cyclohexanone and diacetone alcohol. Examples of the aforementioned ester are as below: methyl acetate, ethyl acetate, propyl acetate, butyl acetate, ethyl 2-hydroxypropionate, methyl 2-hydroxy-2-methpropionate, ethyl 2-hydroxy-2-methpropionate, methyl glycolate, ethyl glycolate, butyl glycolate, methyl lactate, propyl lactate, butyl lactate, methyl 3-hydroxypropionate, ethyl 3-hydroxypropionate, butyl 3-hydroxypropionate, methyl 2-hydroxy-3-methbutyrate, methyl methoxylacetate, ethyl methoxylacetate, butyl methoxylacetate, methyl ethoxylacetate, ethyl ethoxylacetate, propyl ethoxylacetate, butyl ethoxylacetate, methyl propoxylacetate, ethyl propoxylacetate, propyl propoxylacetate, butyl propoxylacetate, methyl butoxyacetate, ethyl butoxyacetate, propyl butoxyacetate, butyl butoxyacetate, 3-methoxylbutyl acetate, methyl 2-methoxylpropionate, ethyl 2-methoxylpropionate, propyl 2-methoxylpropionate, butyl 2-methoxylpropionate, methyl 2-ethoxylpropionate, ethyl 2-ethoxylpropionate, propyl 2-ethoxylpropionate, butyl 2-ethoxylpropionate, methyl 2-butoxypropionate, ethyl 2-butoxypropionate, propyl 2-butoxypropionate, butyl 2-butoxypropionate, methyl 3-methoxylpropionate, ethyl 3-methoxylpropionate, propyl 3-methoxylpropionate, butyl 3-methoxylpropionate, methyl 3-ethoxylpropionate, ethyl 3-ethoxylpropionate, propyl 3-ethoxylpropionate, butyl 3-ethoxylpropionate, methyl 3-propoxylpropionate, ethyl 3-propoxylpropionate, propyl 3-propoxylpropionate, butyl 3-propoxylpropionate, methyl 3-butoxypropionate, ethyl 3-butoxypropionate, propyl 3-butoxypropionate and butyl 3-butoxypropionate.

The preferred examples of the solvent used for the alkali-soluble resin containing the silyl group (C) of the present invention during manufacturing are as below: diethylene glycol dimethyl ether and propylene glycol monomethyl ether acetate. The aforementioned solvent can be used separately or with a mixture of a plurality of the solvents.

Examples of a polymerizing initiator used for the alkali-soluble resin containing the silyl group (C) of the present invention during manufacturing are azo compounds or peroxides. Examples of the aforementioned azo compounds are as below: 2,2'-azobis(isobutyronitrile), 2,2'-azobis(2,4-dimethylvaleronitrile), 2,2'-azobis(4-methoxyl-2,4-dimethylvaleronitrile), 2,2'-azobis(2-methyl butyronitrile), 4,4'-azobis(4-cyano valeric acid) and 2,2'-azobis(dimethyl-2-methylpropionate). Examples of the aforementioned peroxides are as below: dibenzoyl peroxide, dilauroyl peroxide, tert-butyl peroxypivalate, 1,1-di(tert-butylperoxy)cyclohexane and hydrogen peroxide. The aforementioned polymerizing initiator can be used separately or with a mixture of a plurality of the polymerizing initiators.

The weight average molecular weight of the alkali-soluble resin containing the silyl group (C) of the present invention is generally from 3,000 to 100,000, preferably from 4,000 to 80,000, and more preferably from 5,000 to 60,000. The molecular weight of the alkali-soluble resin containing the silyl group (C) of the present invention can be adjusted by using a single resin or using two or more resins with different molecular weights synergistically.

In one embodiment of the invention, based on 100 parts by weight of the used amount of the polysiloxane (A), the used amount of the alkali-soluble resin containing the silyl group (C) is from 0.5 parts by weight to 20 parts by weight; preferably the used amount of the alkali-soluble resin containing the silyl group (C) is from 0.8 parts by weight to 15 parts by weight; more preferably the used amount of the alkali-soluble resin containing the silyl group (C) is from 1.0 parts by weight to 10 parts by weight.

If the alkali-soluble resin containing the silyl group (C) is not used, the resulted thin film formed has poor surface flatness and tapered angle of a pattern.

Though not willing to be limited by theory, it is believed that because the alkali-soluble resin containing the silyl group (C) has un-reacted silyl groups, the alkali-soluble resin containing the silyl group (C) can react with the polysiloxane (A) at a high temperature and enhance the tapered angle of a pattern; beisdes, the silyl group can improve the compatibility with the polysiloxane (A), and the surface flatness is improved.

The kind of the solvent (D) is not particularly limited. The solvent (D), for example, is a compound containing an alcoholic hydroxy group or a cyclic compound containing a carbonyl group.

The compound containing the alcoholic hydroxy group may be, for example, acetol, 3-hydroxy-3-methyl-2-butanone, 4-hydroxy-3-methyl-2-butanone, 5-hydroxy-2-pentanone, 4-hydroxy-4-methyl-2-pentanone (also known as diacetone alcohol, DAA), ethyl lactate, butyl lactate, propylene glycol monomethyl ether, propylene glycol monoethyl ether (PGEE), propylene glycol monomethyl ether acetate (PGMEA), propylene glycol mono-n-propyl ether, propylene glycol mono-n-butyl ether, propylene glycol mono-t-butyl ether, 3-methoxy-1-butanol, 3-methyl-3-methoxy-1-butanol or a combination thereof. It is noted that the compound containing the alcoholic hydroxy group is preferably diacetone alcohol, ethyl lactate, propylene glycol monoethyl ether, propylene glycol methyl ether acetate or combinations thereof. The compound containing the alcoholic hydroxy group may be used singly or in combination.

The cyclic compound containing the carbonyl group may be, for example, γ-butyrolactone, γ-valerolactone, δ-valerolactone, propylene carbonate, N-methyl pyrrolidone, cyclohexanone or cycloheptanone. It is noted that the cyclic compound containing the carbonyl group is preferably γ-butyrolactone, N-methyl pyrrolidone, cyclohexanone or the combinations thereof. The cyclic compound containing the carbonyl group may be used singly or in combination.

The compound containing the alcoholic hydroxy group may be used in combination with the cyclic compound containing the carbonyl group, and the mixing weight ratio of both is not particularly limited. The weight ratio of the compound containing the alcoholic hydroxy group and the cyclic compound containing the carbonyl group ranges preferably from 99/1 to 50/50; more preferably from 95/5 to 60/40. It is noted that when the weight ratio of the compound containing the alcoholic hydroxy group and the cyclic compound containing the carbonyl group is from 99/1 to 50/50 in the solvent (D), the unreacted silanol (Si—OH) groups in the polysiloxane (A) are unlikely to carry on a condensation reaction and storage stability is lowered. In addition, since the compound containing the alcoholic hydroxy group and the cyclic compound containing the carbonyl group have good compatibility with the o-naphthoquinone diazide sulfonic acid ester (B), a whitening phenomenon hardly occurs in the coating film and the transparency of the thin film can be maintained.

Without lowering the effect of the present invention, other solvents may be included. These other solvents may be, for example: (1) esters: ethyl acetate, ethyl acetate, n-propyl, iso-propyl acetate, acetate, n-butyl acetate, isobutyl acetate, propylene glycol monomethyl ether acetate, 3-methoxy-1-butyl acetate or 3-methyl-3-methoxy-1-butyl acetate, etc.; (2) ketones: methyl isobutyl ketone, diisopropyl ketone, or di-isobutyl ketone, etc.; or (3) ethers: diethyl ether, diisopropyl ether, di-n-butyl ether or diphenyl ether.

In one embodiment of the invention, based on 100 parts by weight of the used amount of the polysiloxane (A), the used amount of the solvent (D) is from 100 parts by weight to 1200 parts by weight; preferably from 150 parts by weight to 1000 parts by weight; and more preferably from 200 parts by weight to 800 parts by weight.

The photosensitive polysiloxane composition of the present invention may optionally further include an additive (E). The additives (E) may be, for example, a sensitizer, adhesion auxiliary agent, surfactants, dissolution promoters, defoamers, or combinations thereof.

The kind of the sensitizer is not particularly limited. The sensitizer may use preferably a compound containing a phenolic hydroxyl group, for example:

(1) a trisphenol type compound: such as tris(4-hydroxyphenyl) methane, bis(4-hydroxy-3-methylphenyl)-2-hydroxyphenyl methane, bis(4-hydroxy-2,3,5-trimethylphenyl)-2-hydroxyphenyl methane, bis(4-hydroxy-3,5-dimethylphenyl)-4-hydroxyphenyl methane, bis(4-hydroxy-3,5-dimethylphenyl)-3-hydroxyphenyl methane, bis(4-hydroxy-3,5-methyl-phenyl)-2-hydroxyphenyl methane, bis(4-hydroxy-2,5-dimethyl-phenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethyl-phenyl)-3,4-dihydroxyphenyl methane, bis(4-hydroxy-2,5-dimethylphenyl)-3,4-dihydroxyphenyl methane, bis(4-hydroxy-2,5-dimethylphenyl)-2,4-bis(hydroxyphenyl) methane, bis(4-hydroxy-phenyl)-3-methoxy-4-hydroxyphenyl methane, bis(5-cyclohexyl-4-hydroxy-2-methyl-phenyl)-4-hydroxyphenyl methane, bis(5-cyclohexyl-4-hydroxy-2-methyl-phenyl)-3-hydroxyphenyl methane, bis(5-cyclohexyl-4-hydroxy-2-methyl-phenyl)-2-hydroxyphenyl methane or bis(5-cyclohexyl-4-hydroxy-2-methyl-phenyl)-3,4-dihydroxyphenyl methane, etc.;

(2) a bisphenol type compound: such as bis(2,3,4-trihydroxyphenyl) methane, bis(2,4-dihydroxyphenyl) methane, 2,3,4-trihydroxy-phenyl-4'-hydroxyphenyl methane, 2-(2,3,4-trihydroxyphenyl)-2-(2',3',4'-trihydroxyphenyl) propane, 2-(2,4-dihydroxyphenyl)-2-(2',4'-dihydroxyphenyl) propane, 2-(4-hydroxyphenyl)-2-(4'-hydroxyphenyl) propane, 2-(3-fluoro-4-hydroxyphenyl)-2-(3'-fluoro-4'-hydroxyphenyl) propane, 2-(2,4-dihydroxyphenyl)-2-(4'-hydroxyphenyl) propane, 2-(2,3,4-trihydroxyphenyl)-2-(4'-hydroxyphenyl) propane or 2-(2,3,4-trihydroxyphenyl)-2-(4'-hydroxy-3',5'-dimethylphenyl) propane and the like;

(3) a polynuclear branched compounds: such as 1-[1-(4-hydroxyphenyl)isopropyl]-4-[1,1-bis(4-hydroxyphenyl)-ethyl] phenyl or 1-[1-(3-methyl-4-hydroxyphenyl) isopropyl]-4-[1,1-bis(3-methyl-4-hydroxyphenyl) ethyl] benzene and the like;

(4) a condensation type phenol compound: such as 1,1-bis(4-hydroxyphenyl) cyclohexane, etc.;

(5) a polyhydroxy benzophenones: such as 2,3,4-trihydroxy benzophenone, 2,4,4'-trihydroxy benzophenone, 2,4,6-trihydroxy benzophenone, 2,3,4-trihydroxy-2'-methyl-benzophenone, 2,3,4,4'-tetrahydroxy benzophenone, 2,4,2',4'-tetrahydroxy benzophenone, 2,4,6,3',4'-pentahydroxy benzophenone, 2,3,4,2',4'-pentahydroxy benzophenone, 2,3,4,2',5'-pentahydroxy benzophenone, 2,4,6,3',4',5'-hexahydroxy benzophenone or 2,3,4,3',4',5'-hexahydroxy benzophenone; or (6) the combinations of the above-mentioned compounds containing the phenolic hydroxyl group.

In one embodiment of the invention, based on 100 parts by weight of the used amount of the polysiloxane (A), the used amount of the sensitizer is from 5 parts by weight to 50 parts by weight; preferably from 8 parts by weight to 40 parts by weight; and more preferably from 10 parts by weight to 35 parts by weight.

The adhesion auxiliary agent may be, for example, melamine compounds, silane-based compounds and the like. The role of the adhesion auxiliary agent is to increase the adhesion between the device or component and the thin film that is formed by the photosensitive polysiloxane composition.

Commercially available products of melamine compounds are, for example, manufactured by Mitsui Chemicals, trade names Cymel 300, Cymel-303, etc.; or the products manufactured by Sanwa Chemical, trade names MW-30MH, MW-30, MS-11, MS-001, MX-750 or MX-706.

When using the melamine compound as the adhesion auxiliary agent, based on 100 parts by weight of the used amount of the polysiloxane (A), the used amount of the melamine compound is from 0 part by weight to 20 parts by weight; preferably from 0.5 parts by weight to 18 parts by weight; and more preferably from 1.0 part by weight to 15 parts by weight.

The silane-based compound may be, vinyl trimethoxy silane, vinyl triethoxy silane, 3-acryloyloxy-propyl-trimethoxy silane, vinyl tris(2-methoxyethoxy) silane, N-(2-amino-ethyl)-3-aminopropyl methyl dimethoxy silane, N-(2-aminoethyl)-3-aminopropyl trimethoxy silane, 3-aminopropyl triethoxy silane, 3-glycidoxypropyl trimethoxy silane, 3-glycidoxypropyl dimethyl methoxy-silane, 2-(3,4-epoxy-cyclohexyl)ethyl trimethoxy silane, 3-chloropropyl methyl dimethoxy silane, 3-chloropropyl trimethoxy silane, 3-methacryloxypropyl trimethoxy silane, 3-mercaptopropyl trimethoxy silane or a commercially available product manufactured by Shin-Etsu Chemical Company (trade name of KBM403).

When using the silane-based compound as the adhesion auxiliary agent, based on 100 parts by weight of the used amount of the polysiloxane (A), the used amount of the silane-based compound is 0 part by weight to 2 parts by weight; preferably 0.05 parts by weight to 1 part by weight; and more preferably 0.1 parts by weight to 0.8 parts by weight.

The surfactants may be, for example, anionic surfactants, cationic surfactants, nonionic surfactants, amphoteric surfactants, polysiloxane-based surfactants, fluorine-based surfactants or a combination thereof. Examples of the surfactant include (1) polyoxyethylene alkyl ethers: polyoxyethylene lauryl ether, etc.; (2) polyoxyethylene phenyl ethers: polyoxyethylene octyl phenyl ether, polyoxyethylene nonyl phenyl ether, etc.; (3) polyethylene glycol diesters: polyethylene glycol dilaurate, polyethylene glycol distearate, etc.; (4) sorbitan fatty acid esters; and (5) fatty acid modified poly esters; and (6) tertiary amine modified polyurethanes. Commercially available products of surfactant are, for example, KP (manufactured by Shin-Etsu Chemical), SF-8427 (manufactured by Dow Corning Toray Silicone Co., Ltd.), Polyflow (manufactured by Kyoeisha Grease Chemical), F-Top (manufactured by Tochem Products Co., Ltd.), Megaface (manufactured by Dainippon ink chemical industry (DIC)), Fluorade (by Sumitomo 3M Co., Ltd.), Surflon (manufactured by Asahi Glass), SINOPOL E8008 (Sino Japan Chemical Co. Ltd.), F-475 (manufactured by Dainippon ink chemical industry) or combinations thereof.

Based on 100 parts by weight of the used amount of the polysiloxane (A), the used amount of the surfactant is from 0.5 parts by weight to 50 parts by weight; preferably from 1 part by weight to 40 parts by weight; and more preferably from 3 parts by weight to 30 parts by weight.

Examples of the defoamers include Surfynol MD-20, Surfynol MD-30, EnviroGem AD01, EnviroGem AE01, EnviroGem AE02, Surfynol DF110D, Surfynol 104E, Surfynol 420, Surfynol DF37, Surfynol DF58, Surfynol DF66, Surfynol DF70 and Surfynol DF210 (manufactured by Air products) and the like.

Based on 100 parts by weight of the used amount of the polysiloxane (A), the used amount of the defoamer is from 1 part by weight to 10 parts by weight; preferably from 2 parts by weight to 9 parts by weight; and more preferably from 3 parts by weight to 8 parts by weight.

Examples of the dissolution promoters include N-hydroxydicarboxylic imide and the compound containing the phenolic hydroxyl group. For example, the dissolution promoter is the compound containing the phenolic hydroxyl group used in the o-naphthoquinone diazide sulfonic acid ester (B).

Based on 100 parts by weight of the used amount of the polysiloxane (A), the used amount of the dissolution promoter is from 1 part by weight to 20 parts by weight; preferably from 2 parts by weight to 15 parts by weight; and more preferably from 3 parts by weight to 10 parts by weight.

The photosensitive polysiloxane composition may be prepared in the following manner placing the polysiloxane (A), the o-naphthoquinone diazide sulfonic acid ester (B), the alkali-soluble resin containing the silyl group (C) and the solvent (D) in a blender and stirring them until homogeneously mixed into a solution state. If necessary, the additives (E) may be added.

The present invention also provides a method for forming a thin film on a substrate comprising applying the photosensitive polysiloxane composition as mentioned above on the substrate.

The present invention also provides a device comprising the thin film. Preferably, the thin fim is a planarization film of a TFT substrate in a liquid crystal display element or organic light-emitting display device, an interlayer insulating film or an overcoat of a core material or a protective material in a waveguide.

The following descriptions detail the method of forming the thin film, comprising: using a photosensitive polysiloxane composition to form a pre-baked coating film, pattern-exposing of the pre-baked coating film, removing the exposed region of the film by an alkali developer to form a pattern, and performing a post-baking treatment to form the thin film.

—Forming a Pre-Baked Coating Film—

By spin coating, cast coating, or roll coater coating method, the photosensitive polysiloxane composition in the above solution state is coated onto the device to be protected (hereinafter referred to as substrate), to form a coating film. The above-mentioned substrate may be alkali-free glass, soda lime glass, Pyrex glass, quartz glass, or glasses adhered with the transparent conductive film used in a liquid crystal display device, or the substrate (such as, silicon substrate) used in the photoelectric conversion apparatus (such as a solid-state imaging apparatus).

After forming the coating film, most of the organic solvent on the photosensitive polysiloxane composition is removed by reducing pressure and drying method, then all the residual organic solvent is removed by pre-baking method, to form a pre-baked coating film.

The above-mentioned operation condition may be different from the kinds of component and ratio. Generally, reducing pressure and drying is at a pressure of 0 to 200 Torr for 1 seconds to 60 seconds, and pre-baking is at a temperature between 70° C. to 110° C. for 1 minute to 15 minutes.

—Pattern-Exposing—

A mask having a specific pattern is used to perform exposure for the above-mentioned pre-baked coating film. The light used in the exposure process, is preferably ultraviolet (UV) rays (g line, b line, i line, etc.), and the device used to provide UV rays may be an ultra high-pressure mercury lamp or a metal halide lamp.

—Developing—

Unnecessary portions of the above exposed pre-baked coating film are removed by immersing the pre-baked coating film in the developer solution at a temperature between 23±2° C. and developing for about 15 seconds to 5 minutes, so as to form a semi-finished product of the thin film with a predetermined pattern on the substrate. The developer may be alkaline compounds, such as, sodium hydroxide, potassium hydroxide, sodium carbonate, sodium hydrogen carbonate, potassium carbonate, potassium bicarbonate, sodium silicate, sodium methylsilicate, aqueous ammonia, ethylamine, diethylamine, dimethyl ethanolamine, tetramethylammonium hydroxide (THAM), tetraethylammonium hydroxide, choline, pyrrole, piperidine, 1,8-diaza-bicyclo-(5,4,0)-7-undecene.

It is noted that if the concentration of the developer is too high, the specific pattern may be damaged or the resolution of the specific pattern may be deteriorated. If the concentration of the developer is too low, poor development may happen, the specific pattern may not be formed or residues of the composition remain in exposed portions. Therefore, the concentration of the developer affects the formation of the specific pattern of the subsequent photosensitive polysiloxane composition after exposure. The concentration range of the liquid developer is preferably from 0.001 wt % to 10 wt %; more preferably from 0.005 wt % to 5 wt %; further more preferably from 0.01 wt % to 1 wt %. The present embodiment of the present invention employs a developer of 2.38 wt % tetramethylammonium hydroxide. It is noted that even using a lower concentration of the developer, the photosensitive polysiloxane composition of the present invention is capable of forming a fine pattern.

—Post-Baking—

The substrate (semi-finished product of the thin film with the predetermined pattern on the substrate) is washed with water to remove the unwanted portions of the above-mentioned exposed pre-baked coating film. Then, compressed air or compressed nitrogen is used to dry up the semi-finished product of the thin film with the predetermined pattern. Finally, the semi-finished product of the thin film with the predetermined pattern is post-baked on a heating plate or in an oven. The heating temperature is set between 100° C. to 250° C., and the heating time with the heating plate is 1 to 60 minutes or the heating time with the oven is 5 to 90 minutes. Thereby, the semi-finished product of the thin film with the predetermined pattern is cured to form a thin film.

the polysiloxane (A-1). The kinds and used amounts of the raw materials of the polysiloxane (A-1) are shown in Table 1.

Synthesis of Polysiloxane (A-2) to (A-4)

Synthesis examples (A-2) to (A-4) were practiced with the analogous method as in Synthesis example (A-1) by using various kinds or amounts of the components of the silane monomer and polysiloxane which were listed in Table 1. The amounts of solvent and oxalic acid, the reaction temperature and the time of polymerization and condensation are different from the aforementioned polysiloxane (A-1) which are also listed in Table 1.

TABLE 1

| Preparation | Composition | | | | | | | | | | | | |
|---|---|---|---|---|---|---|---|---|---|---|---|---|---|
| | silane monomer/polysiloxane (mol) | | | | | | | | Catalyst (g) | | | | |
| | MTMS | DMDMS | PTMS | PTES | GF-20 | TMSG | TMSOX-D | DMS-S27 | Solvent (g) PGEE | DAA | DI water | Oxalic acid | Temp. (° C.) | Time (hour) |
| A-1 | 0.30 | | 0.65 | | 0.05 | | | | 200 | | 75 | 0.40 | 105 | 6 |
| A-2 | | 0.40 | 0.40 | 0.20 | | | | | 100 | 100 | 75 | 0.40 | 110 | 5 |
| A-3 | | 0.60 | 0.35 | | | 0.05 | | | 200 | | 75 | 0.35 | 105 | 6 |
| A-4 | 0.65 | | | 0.25 | | | 0.09 | 0.01 | 200 | | 75 | 0.45 | 110 | 6 |

| | | MW |
|---|---|---|
| MTMS | Methyltrimethoxysilane | 136 |
| DMDMS | Dimethyldimethoxysilane | 120 |
| PTMS | Phenyltrimethoxysilane | 198 |
| PTES | Phenyltriethoxysilane | 240 |
| GF-20 | 3-(triethoxysilyl)propyl succinic anhydride | 304 |
| TMSG | 3-(trimethoxysilyl)propyl glutaric anhydride | 276 |
| TMSOX-D | 2-oxetanylbutoxypropyltrimethoxysilane | 278 |
| DMS-S27 | the silanol end portion of polysiloxane(manufactured by Gelest Co., Ltd.) | 18000 |
| PGEE | Propylene glycol monoethyl ether | 104 |
| DAA | Diacetone alcohol | 116 |
| DI water | | 18 |
| Oxalic acid | | 90 |

The present invention will provide more details hereinafter in the following embodiments, but it should be understood that these examples are only illustrative and for illustrative purposes and should not be construed to limit the present invention.

Synthesis Example

Synthesis of Polysiloxane (A-1)

Following adding 0.30 mole of methyl trimethoxy silane (MTMS), 0.65 mole of phenyltrimethoxysilane (hereinafter referred to as PTMS), 0.05 mole of 3-(triethoxysilyl) propyl succinic anhydride (hereinafter referred to as GF-20) and 200 g of propylene glycol monoethyl ether (hereinafter referred to PGEE) into a 500 ml three-necked flask, an aqueous oxalic acid solution (0.40 g oxalic acid/75 g water) was added at room temperature with stirring within 30 minutes. Next, the flask was immersed at 30° C. in oil bath and stirred for 30 minutes. Then, within 30 minutes, the temperature of the oil bath was raised to 120° C. After the solution temperature was dropped to 105° C., heating was resumed with stirring for polymerization for 6 hours. Then again, the solvent was removed using distillation to obtain Synthesis of Alkali-Soluble Resin Containing the Silyl Group (C-1)

A 1000 mL four-necked conical flask equipped with a nitrogen inlet, a stirrer, a heater, a condenser and a thermometer was purged with nitrogen gas, and the components listed in Table 2 are charged to the flask. The aforementioned components comprising 5 parts by weight of 2-methacryloyloxyethyl succinate monoester (hereinafter abbreviated as HOMS), 10 parts by weight of 3-methacryloxypropyltrimethoxysilane (hereinafter abbreviated as MPTMS), 10 parts by weight of 2-hydroxyethyl methacrylate (hereinafter abbreviated as HEMA), 20 parts by weight of isobornyl methacrylate (hereinafter abbreviated as IBOMA), 55 parts by weight of styrene monomer (hereinafter abbreviated as SM), 2.4 parts by weight of 2,2'-azobis(2-methyl butyronitrile) (hereinafter abbreviated as AMBN) and 240 parts by weight of diethylene glycol dimethyl ether (hereinafter abbreviated as Diglyme) were stirred slowly, heated to 85° C. and left to polycondense for 5 hours at the same temperature. Subsequently, after the solvent was volatilized, the alkali-soluble resin (C-1) was obtained.

Synthesis of Alkali-Soluble Resin Containing the Silyl Group (C-2) to (C-8)

Synthesis examples (C-2) to (C-8) were practiced with the analogous method as in Synthesis example (C-1) by using various kinds or amounts of the components of the monomer which are listed in Table 2. The amounts of solvent and catalyst, the reaction temperature and the time of polymerization and condensation are different from the aforementioned alkali-soluble resin containing the silyl group (C-1) which are also listed in Table 2.

100×100×0.7 mm in size, and then pre-baked for 2 minutes at 100° C. to obtain a pre-baked coating film of about 2 μm in thickness. And then, the pre-baked coating film was placed under the light mask with a given pattern, and ultraviolet light of 140 mJ/cm² was used to irradiate the film. Afterwards, the exposed coating film was immersed in 2.38% TMAH solution for 60 seconds at 23° C. to remove the unexposed parts, and then the film was washed with pure water; and placed under the light mask with the given pattern, and exposed with the ultraviolet light of 200

TABLE 2

| | Composition monomer (parts by weight) | | | | | | | | | |
|---|---|---|---|---|---|---|---|---|---|---|
| | c-1 | | c-2 | | | c-3 | | | | |
| Preparation | MAA | HOMS | MPTMS | MPTES | FM-0711 | GMA | HEMA | TBMA | FA-513M | IBOMA |
| C-1 |  | 5 | 10 |  |  |  | 10 |  |  | 20 |
| C-2 | 25 |  |  |  | 5 | 20 | 20 | 30 |  |  |
| C-3 | 10 | 5 | 20 |  |  |  |  |  | 30 |  |
| C-4 | 35 |  | 10 | 20 |  |  |  |  |  |  |
| C-5 |  | 20 | 30 |  | 10 | 10 |  | 20 |  | 10 |
| C-6 | 15 |  | 65 |  |  |  |  |  |  |  |
| C-7 | 15 |  |  | 45 | 5 |  |  |  | 35 |  |
| C-8 | 20 |  |  |  |  | 15 | 10 |  | 25 |  |

| | Composition | | | | | | | |
|---|---|---|---|---|---|---|---|---|
| | monomer (parts by weight) c-3 | | Solvent (parts by weight) | | Catalyst (parts by weight) | | Temp. | Time |
| Preparation | BzMA | SM | Diglyme | PGMEA | AMBN | MAA | (° C.) | (hour) |
| C-1 |  | 55 | 240 |  | 2.4 |  | 85 | 5 |
| C-2 |  |  | 200 | 40 | 3.0 |  | 85 | 5 |
| C-3 | 35 |  |  | 240 |  | 2.4 | 80 | 6 |
| C-4 | 30 | 5 | 240 |  | 2.4 |  | 85 | 5 |
| C-5 |  |  | 240 |  |  | 3.0 | 85 | 6 |
| C-6 | 20 |  | 200 | 40 | 2.4 |  | 85 | 5 |
| C-7 |  |  | 240 |  | 3.0 |  | 80 | 5 |
| C-8 |  | 30 | 240 |  |  | 3.0 | 80 | 6 |

| | |
|---|---|
| AMBN | 2,2'-azobis-2-methyl butyronitrile |
| ADVN | 2,2'-azobis(2,4-dimethylvaleronitrile) |
| MAA | methacrylic acid |
| HOMS | 2-methacryloyloxyethyl succinate monoester |
| MPTMS | 3-methacryloxypropyltrimethoxysilane |
| MPTES | 3-methacryloxypropyltriethoxysilane |
| GMA | glycidyl methacylate |
| HEMA | 2-hydroxyethyl methacrylate |
| TBMA | t-butyl methacrylate |
| FA-513M | dicyclopentanyl methacrylate |
| IBOMA | Isobornyl methacrylate |
| BzMA | benzyl methacrylate |
| SM | styrene monomer |
| Diglyme | diethylene glycol dimethyl ether |
| PGMEA | Propylene glycol monoethyl ether acetate |

Example 1

One-hundred parts by weight of the used amount of the polysiloxane (A-1), 2 parts by weight of the ortho-naphthoquinone diazide sulfonic acid ester (B-1) formed from 1-[1-(4-hydroxyphenyl) propyl]-4-[1,1-bis(4-hydroxyphenyl)ethyl]benzene and ortho-naphthoquinone diazide-5-sulfonic acid (B-1), and 0.5 parts by weight of alkali-soluble resin containing the silyl group (C-1) were mixed and dissolved in 100 parts by weight of the propylene glycol monomethyl ether acetate (D-1) completely, so as to form the photosensitive polysiloxane composition of Example 1.

—Formation of Thin Film on Glass—

Various photosensitive polysiloxane compositions were spin coated independently on a prime glass substrate of mJ/cm². Finally, the film was post-baked for 60 minutes at 235° C., so as to form the film on the prime glass substrate.

The evaluation results of the thin film of Example 1 are shown in Table 3.

Examples 2 to 12 and Comparative Examples 1 to 4

Examples 2 to 12 and Comparative Examples 1 to 4 were practiced with the same method as in Example 1 by using various kinds or amounts of the components, the formulas. The evaluation results of which are also listed in Table 3 and Table 4.

TABLE 3

| Composition | | Example 1 | 2 | 3 | 4 | 5 | 6 | 7 | 8 | 9 | 10 | 11 | 12 |
|---|---|---|---|---|---|---|---|---|---|---|---|---|---|
| polysiloxane (A) (parts by weight) | A-1 | 100 | | | | | | 100 | | 50 | | 80 | |
| | A-2 | | 100 | | | | 100 | | 50 | | | 20 | 20 |
| | A-3 | | | 100 | | 100 | | | | 50 | 100 | | 80 |
| | A-4 | | | | 100 | | | | 50 | | | | |
| o-naphthoquinone diazide sulfonic acid ester (B) (parts by weight) | B-1 | 2 | 10 | 15 | 15 | 5 | 20 | 20 | | 30 | 10 | 30 | |
| | B-2 | | | | | 20 | 10 | | 20 | | 5 | | 20 |
| alkali-soluble resin containing a silyl group (C) (parts by weight) | C-1 | 0.5 | | | | | | | | | 3 | | |
| | C-2 | | | | 5 | | | | | 2 | | | |
| | C-3 | | | | | 10 | | | | | 2 | | |
| | C-4 | | 3 | | | | 12 | | | | | 5 | |
| | C-5 | | | | | | | 15 | | 3 | | 5 | |
| | C-6 | | | | | | | | 20 | | | | |
| | C-7 | | | | | | | | | 5 | | | 10 |
| | C-8 | | | | | | | | | | | | |
| Solvent (D) (parts by weight) | D-1 | 100 | 200 | 500 | 300 | 300 | 800 | 1000 | 1200 | 500 | | 1000 | 1000 |
| | D-2 | | | | 200 | | | 200 | | | 500 | | |
| | D-3 | | | | | 300 | | | | | | | |
| additive (E) (parts by weight) | E-1 | | 1 | | | | | | 0.5 | | | | |
| | E-2 | | | | 3 | | | | | | 2 | | |
| Evaluation | Surface Flatness | ○ | ○ | ○ | ○ | ○ | ○ | ○ | ○ | ○ | ○ | ○ | ○ |
| | Tapered Angle | ◎ | ○ | ◎ | ◎ | ◎ | ○ | ◎ | ◎ | ◎ | ◎ | ◎ | ◎ |

TABLE 4

| Composition | | Comparative Examples 1 | 2 | 3 | 4 |
|---|---|---|---|---|---|
| polysiloxane (A) (parts by weight) | A-1 | 100 | | | |
| | A-2 | | 100 | 100 | |
| | A-3 | | | | 100 |
| | A-4 | | | | |
| o-naphthoquinone diazide sulfonic acid ester (B) (parts by weight) | B-1 | 15 | | 20 | 15 |
| | B-2 | | 15 | | |
| alkali-soluble resin containing a silyl group (C) (parts by weight) | C-1 | | | | |
| | C-2 | | | | |
| | C-3 | | | | |
| | C-4 | | | | |
| | C-5 | | | | |
| | C-6 | | | | |
| | C-7 | | | | |
| | C-8 | | | 5.0 | 10.0 |
| Solvent (D) (parts by weight) | D-1 | 500 | 500 | 400 | 800 |
| | D-2 | | | | |
| | D-3 | | | 400 | |
| additive (E) (parts by weight) | E-1 | | | | |
| | E-2 | | | | |
| Evaluation | Surface Flatness | X | X | X | X |
| | Tapered Angle | X | X | X | X |

In Table3 and Table4:

B-1 ortho-naphthoquinone diazide sulfonic acid ester formed from 1-[1-(4-hydroxyphenyl) propyl]-4-[1,1-bis(4-hydroxyphenyl)ethyl]benzene and ortho-naphthoquinone diazide-5-sulfonic acid B-2 ortho-naphthoquinone diazide sulfonic acid ester formed from 2,3,4-trihydroxy-benzophenone and ortho-naphthoquinone diazide-5 sulfonic acid D-1 propylene glycol monomethyl ether acetate (PGMEA)

D-2 4-hydroxy-4-methyl-2-pentanone (DAA)

D-3 cyclohexanone

E-1 SF-8427 (manufactured by Dow Corning Toray Silicone Co., Ltd.)

E-2 3-glycidoxy propyl trimethoxysilicane (trade name of KBM403, manufactured by Shin-Etsu Chemical Co., Ltd.)

—Evaluation—

(1) Surface Flatness

Figure 1:
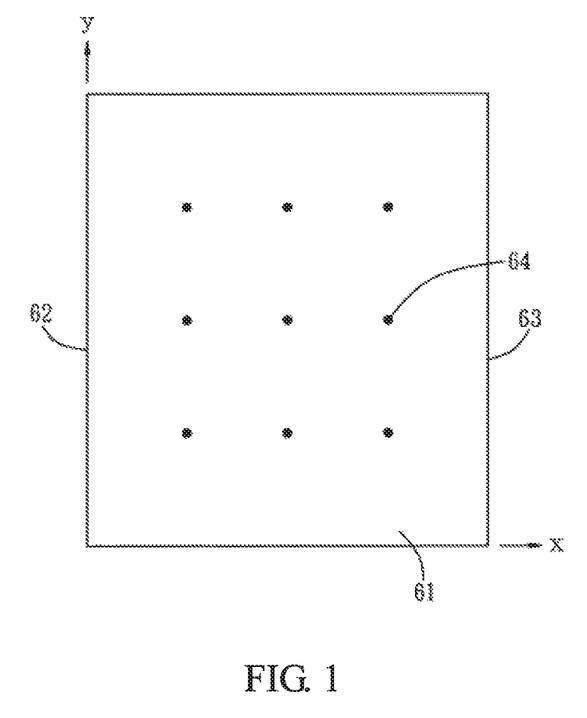
FIG. 1 shows the distribution of the film thickness.

Various photosensitive polysiloxane compositions were spin coated independently on a rectangle glass substrate of 960×1100 mm in size, and then pre-baked for 2 minutes at 100° C. to obtain a pre-baked coating film. The thickness of the film was measured by Tencor α-step stylus analyzer. FIG. 1 shows the distribution of the film thickness; wherein, the length of glass substrate (61) along x-axis is 960 nm and along y-axis is 1000 nm. Taking the substrate (61) at x=0 as a beginning portion (62), a portion opposite the beginning portion (62) of the substrate (61) is as an end portion (63). The spin-coated direction of the photosensitive polysiloxane composition started from the beginning portion (62) to the end portion (63) along the x-axis.

The (x,y) coordinates of the FT (avg) is (240,275), (480,275), (720,275), (240,550), (720,550), (240,825), (480,825) and (720,825). The mean value of thickness of 9 determination points (64) is measured.

FT(x,y) max: the maximum thickness of the aforementioned of 9 determination point (64).

FT(x,y) min: the minimum thickness of the aforementioned of 9 determination point (64).

The surface flatness can determine by the following formula:

$$\text{Surface Flatness} = (FT(x,y)\text{max} - FT(x,y)\text{min})/(2 \times FT(\text{avg})) \times 100\%$$

◎: Surface Flatness<2%

○: 2% ☐ Surface Flatness<5%

X: 5%≤Surface Flatness (2) Tapered Angle: the film of glass substrate (14) was detected with a scanning electron microscope (SEM), the tapered angle was measured according to the sharp of edge profile.

Figure 2:
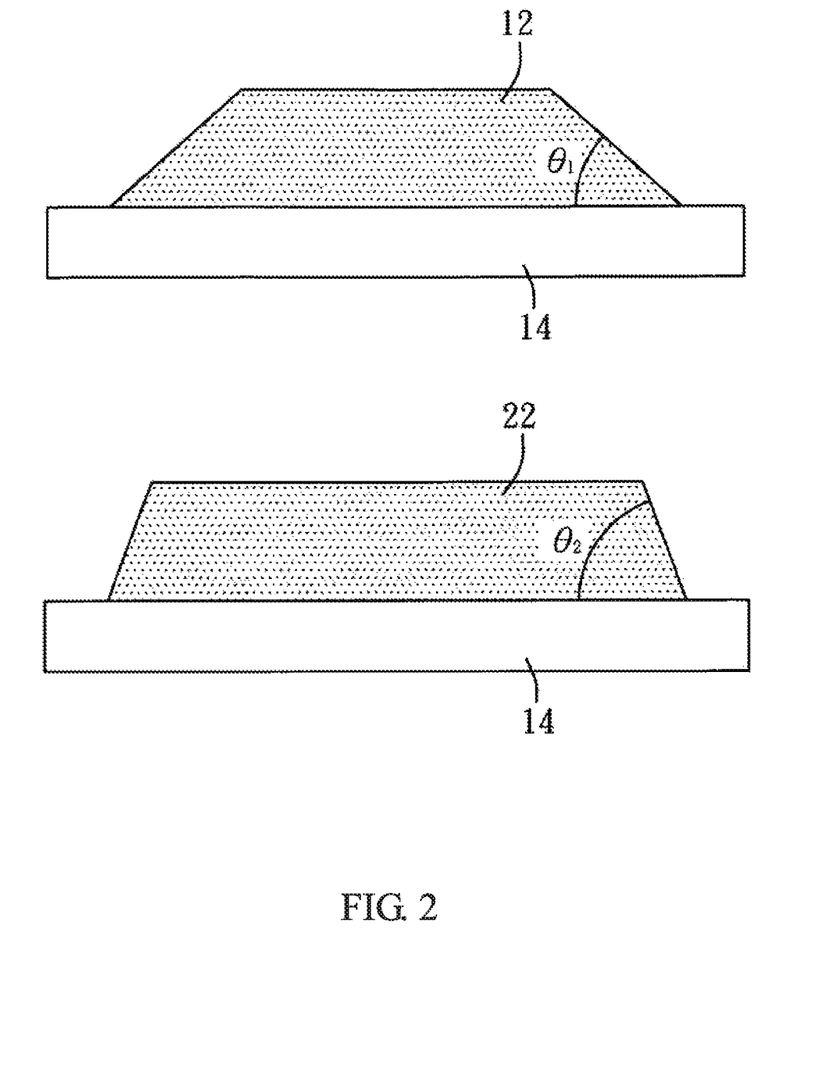
FIG. 2 shows the tarpered angle of the film.

◎: the tapered angle of the thin film (22) shown in FIG. 2 is 55° ☐$\theta_2$<70°

○: the tapered angle of the thin film (22) shown in FIG. 2 is 40° ☐$\theta_2$<55°

Δ: the tapered angle of the thin film (12) shown in FIG. 2 is 30° ☐$\theta_1$<40°

☐: the tapered angle of the thin film (12) shown in FIG. 2 is 10° ☐≥$_1$<30°

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. A photosensitive polysiloxane composition comprising:

a polysiloxane (A);

an o-naphthoquinone diazide sulfonic acid ester (B);

an alkali-soluble resin containing a silyl group (C); and a solvent (D);

wherein the polysiloxane (A) is copolymerized by a compound represented by Formula (4), $$Si(R_a)_W(OR_b)_{4-W} \quad \text{Formula (4)},$$

wherein:

$R_a$ represents hydrogen, an alkyl group containing 1 to 10 carbon atoms, an alkenyl group containing 2 to 10 carbon atoms, an aryl group containing 6 to 15 carbon atoms, an alkyl group containing an acid anhydride group, an alkyl group containing an epoxy group, or an alkoxy group containing an epoxy group; when $R_a$ is plural, each $R_a$ is the same or different; at least one of $R_a$ represents the alkyl group containing the acid anhydride group;

$R_b$ represents hydrogen, an alkyl group containing 1 to 6 carbon atoms, an acyl group containing 1 to 6 carbon atoms, an aryl group containing 6 to 15 carbon atoms; when $R_b$ is plural, each $R_b$ is the same or different; and W represents an integer from 0 to 3.

2. The photosensitive polysiloxane composition according to claim 1, wherein the alkali-soluble resin containing the silyl group (C) is copolymerized by an unsaturated carboxylic acid or unsaturated carboxylic anhydride (c-1), an unsaturated compound containing a silyl group (c-2) represented by Formula (1) and/or an other unsaturated compounds (c-3), Formula (1)

wherein:

$R^1$ represents a hydrogen atom or a methyl group;

a represents an integer selected from 1 to 6;

$R^2$ and $R^3$ independently represent an alkyl group containing 1 to 12 carbon atoms, a phenyl group, an alkoxy group containing 1 to 6 carbon atoms, or a group represented by Formula (2);

b represents an integer selected from 1 to 150; when $R^2$ and $R^3$ are plural, each $R^2$ and $R^3$ are the same or different;

$R^4$ represents an alkyl group containing 1 to 6 carbon atoms or a group represented by Formula (3);

Formula (2)

wherein:

$R^5$, $R^6$ and $R^7$ independently represent an alkyl group containing 1 to 12 carbon atoms or a phenyl group;

c represents an integer selected from 2 to 13; when $R^6$ and $R^7$ are plural, each $R^6$ and $R^7$ are the same or different; and Formula (3)

wherein:

$R^8$, $R^9$ and $R^{10}$ independently represent an alkyl group containing 1 to 12 carbon atoms or a phenyl group.

3. The photosensitive polysiloxane composition according to claim 1, wherein based on 100 parts by weight of the used amount of the polysiloxane (A), the used amount of the o-naphthoquinone diazide sulfonic acid ester (B) is from 2 parts by weight to 30 parts by weight; the used amount of the alkali-soluble resin containing the silyl group (C) is from 0.5 part by weight to 20 parts by weight; and the used amount of the solvent (D) is from 100 parts by weight to 1200 parts by weight.

* * * * *